US008822317B2

(12) United States Patent
Cheng et al.

(10) Patent No.: US 8,822,317 B2
(45) Date of Patent: Sep. 2, 2014

(54) SELF-ALIGNED III-V MOSFET DIFFUSION REGIONS AND SILICIDE-LIKE ALLOY CONTACT

(75) Inventors: Cheng-Wei Cheng, White Plains, NY (US); Augustin J. Hong, White Plains, NY (US); Jeehwan Kim, Los Angeles, CA (US); Devendra K. Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 13/603,739

(22) Filed: Sep. 5, 2012

(65) Prior Publication Data

US 2013/0001659 A1 Jan. 3, 2013

Related U.S. Application Data

(63) Continuation of application No. 13/173,680, filed on Jun. 30, 2011.

(51) Int. Cl.
*H01L 21/336* (2006.01)

(52) U.S. Cl.
USPC ........... 438/558; 438/285; 438/559; 438/560; 257/E21.441

(58) Field of Classification Search
USPC ........................................................ 257/288
See application file for complete search history.

(56) References Cited

U.S. PATENT DOCUMENTS 5,593,905 A * 1/1997 Johnson et al. ............... 438/365
6,096,599 A * 8/2000 Kepler et al. ................. 438/249
2001/0005036 A1* 6/2001 Porst et al. ................... 257/591
2004/0029317 A1* 2/2004 Tokushige .................... 438/118
2004/0104442 A1* 6/2004 Feudel et al. ................ 257/410
2008/0135878 A1* 6/2008 Kim et al. ..................... 257/192
2009/0218636 A1* 9/2009 Lee et al. ...................... 257/394

OTHER PUBLICATIONS

Cooke, M. "Self-Aligned Ni—InGaAs As Source-Drain for InGaAs MOSFET" Technology Focus: Microelectronics, Compounds & Advanced Silicon, vol. 6, Issue 1. Feb. 2011. pp. 104-105.
Guo, H., et al. "A New Self-Aligned Contact Technology for III-V MOSFETS" International Symposium on VLSI Technology, Systems and Applications (VLSI-TSA). Apr. 2010. pp. 152-153.
Kim, S., et al. "Self-Aligned Metal Source/Drain InxGa1—xAs N-Metal-Oxide-Semiconductor Field-Effect Transistors Using Ni—InGaAs Alloy" Applied Physics Express, vol. 4, No. 2. Feb. 2011. pp. 1-3.
Singisetti, U., et al. "InGaAs Channel MOSFET With Self-Aligned Source/Drain MBE Regrowth Technology" Phys. Status Solidi C 6, No. 6. Apr. 2009. pp. 1394-1398.

* cited by examiner

*Primary Examiner* — Angel Roman
(74) *Attorney, Agent, or Firm* — Tutunjian & Bitetto, P.C.; Louis Percello

(57) ABSTRACT

A metal oxide semiconductor field effect transistor and method for forming the same include exposing portions on a substrate adjacent to a gate stack, forming a dopant layer over the gate stack and in contact with the substrate in the portions exposed and annealing the dopant layer to drive dopants into the substrate to form self-aligned dopant regions in the substrate. The dopant layer is removed. A metal containing layer is deposited over the gate stack and in contact with the substrate in the exposed portions. The metal containing layer is annealed to drive metal into the substrate to form self-aligned contact regions in a metal alloy formed in the substrate within the dopant regions. The metal layer is then removed.

14 Claims, 5 Drawing Sheets

SELF-ALIGNED III-V MOSFET DIFFUSION REGIONS AND SILICIDE-LIKE ALLOY CONTACT

RELATED APPLICATION DATA

This application is a Continuation application of co-pending U.S. patent application Ser. No. 13/173,680 filed on Jun. 30, 2011, incorporated herein by reference in its entirety.

BACKGROUND

1. Technical Field

The present invention relates to semiconductor devices and more particularly to a self-aligned metal oxide semiconductor field effect transistor (MOSFET) and integration methods.

2. Description of the Related Art

The performance enhancement of Si complementary metal-oxide-semiconductor (CMOS) has traditionally been achieved by device scaling. However, performance enhancement and the reduction of device size has become more challenging as devices achieve nanoscale dimensions. III-V compound semiconductors with high electron mobility and low electron effective mass have been suggested as a new channel material of n-metal-oxide-semiconductor field-effect transistors (n-MOSFETs). However, it is challenging to achieve III-V MOSFETs because there is no mature silicide-like process for III-V MOSFET junctions.

SUMMARY

A metal oxide semiconductor field effect transistor and method for forming the same include exposing portions on a substrate adjacent to a gate stack, forming a dopant layer over the gate stack and in contact with the substrate in the portions exposed and annealing the dopant layer to drive dopants into the substrate to form self-aligned dopant regions in the substrate. The dopant layer is removed. A metal containing layer is deposited over the gate stack and in contact with the substrate in the exposed portions. The metal containing layer is annealed to drive metal into the substrate to form self-aligned contact regions in a metal alloy formed in the substrate within the dopant regions. The metal layer is then removed.

A method for forming a metal oxide semiconductor field effect transistor includes exposing portions on a p-type III-V substrate adjacent to a gate stack; forming a dopant layer containing Ge over the gate stack and in contact with the substrate in the portions exposed; annealing the dopant layer to drive Ge dopants into the substrate to form self-aligned dopant regions in the substrate and to convert the p-type substrate to n-type in the dopant regions; removing the dopant layer; depositing a metal containing layer having Ni over the gate stack and in contact with the substrate in the exposed portions; annealing the metal containing layer to drive Ni into the substrate to form self-aligned contact regions in a metal alloy formed in the substrate within the dopant regions; and removing the metal containing layer.

A metal oxide field effect transistor device includes a III-V substrate and a source region and a drain region self-aligned to a gate stack and formed from diffused dopants with a dopant concentration sufficient to make the source region and the drain region n-type. Contact regions are self-aligned with and formed within each of the source region and the drain region, the contact regions being formed from a diffused metal.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
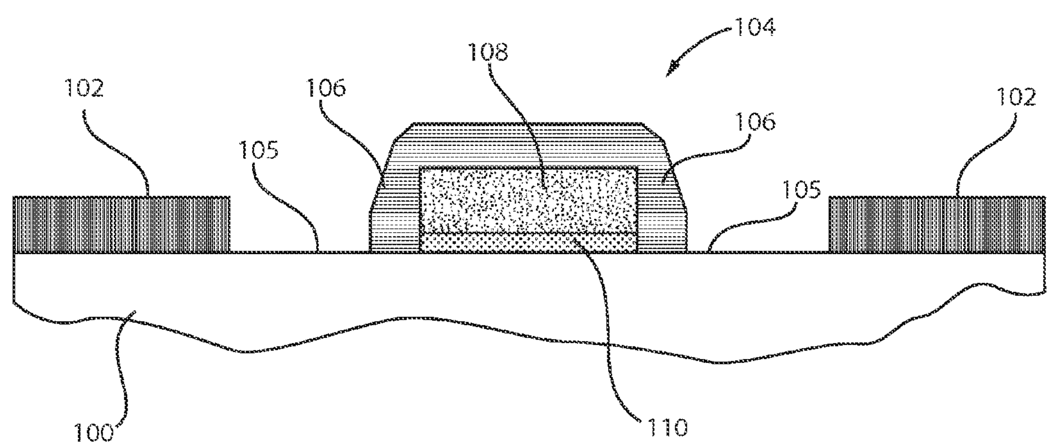
FIG. 1 is a cross-sectional view of a partially fabricated MOSFET device showing exposed substrate regions for locating source/drain regions in accordance with the present principles.

The present principles provide a transistor device preferably formed in a III-V substrate that has self-aligned source and drain regions. In addition, metal contacts are also self-aligned and formed on the source and drain regions. The transistor device may include a metal oxide semiconductor field effect transistor (MOSFET). In one embodiment, a p-type substrate is employed. The source and drain regions may be formed by employing a self-aligned germanium layer, which is diffused into the substrate to convert the p-type substrate into an n-type source/drain region.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being “on” or “over” another element, it can be directly on the other element or intervening elements may also be present. In contrast, when an element is referred to as being “directly on” or “directly over” another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a cross-sectional view of a partially fabricated transistor device is shown in accordance with one exemplary embodiment. A substrate 100 includes a crystalline material, and preferably includes a III-V material such as GaAs, InGaAs, InP or other similar materials. In the present example, substrate 100 includes a p-type InGaAs material, although other materials may be employed. A field dielectric 102, such as an oxide, is formed and patterned on the substrate 100 to define source and drain regions adjacent to a gate stack 104. In other designs, the field dielectric 102 may include shallow trench isolation (STI) or other dielectric isolation regions.

The gate stack 104 may include a high-dielectric constant (high-k) material 110, such as, hafnium silicate, zirconium silicate, hafnium dioxide, zirconium dioxide, etc. Other dielectric materials may also be employed and may be dependent on the design of the device. A gate conductor 108 is formed on the high-k layer 110. The layers 108 and 110 may be patterned, shaped or formed by known methods. A dielectric layer 106 is formed over the layers 108 and 110. The dielectric layer 106 may include a silicon nitride ($SiN_x$) material. Dielectric layer 106 may be selectively deposited or selectively etched to cover layers 108 and 110 as depicted.

Regions 105 include exposed portions of the substrate 100, and are preferably formed adjacent to the gate stack 104. Regions 105 are cleaned of native oxide by employing an etch process. The etch process may include, e.g., a HF or HCl wet etch.

Figure 2:
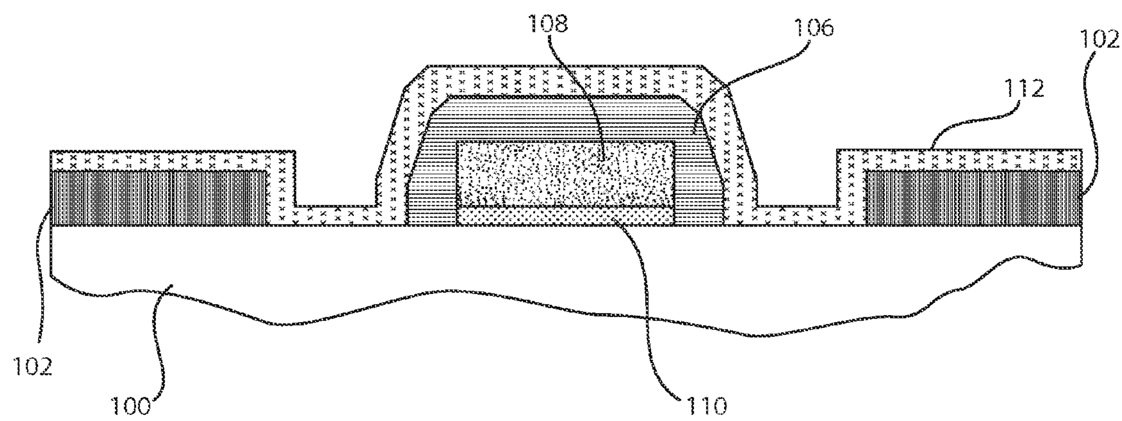
FIG. 2 is a cross-sectional view of the partially fabricated MOSFET device of FIG. 1 showing a dopant layer formed over the device in accordance with the present principles.

Referring to FIG. 2, a dopant layer 112 is conformally formed over the topography of the device. The dopant layer 112 preferably includes germanium (Ge) or a compound including germanium. Other dopant layers may also be employed such as layers containing silicon, sulfur, etc. The dopant layer 112 may include a thickness of between about 0.1 nm (one atomic layer) to about 100 nm. In one embodiment, a chemical vapor deposition (CVD) process may be employed to form the conformal dopant layer 112. In one preferred embodiment, a plasma enhanced CVD (PECVD) process is employed. In one embodiment, dopant layer 112 may be formed after dipping the device in the chemical solution (e.g., ammonium sulfide).

Figure 3:
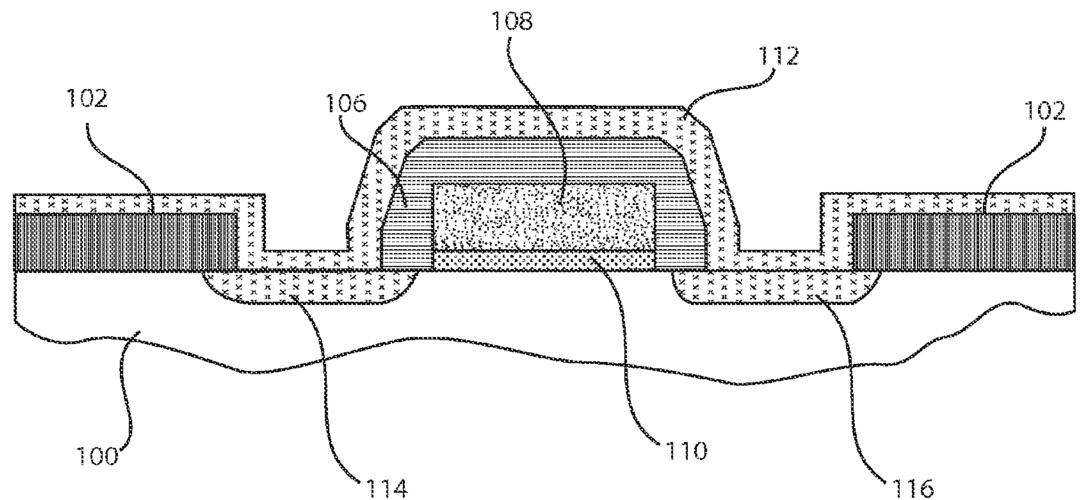
FIG. 3 is a cross-sectional view of the partially fabricated MOSFET device of FIG. 2 showing dopants driven into the substrate at the exposed regions by an anneal process in accordance with the present principles.

Referring to FIG. 3, an anneal process is performed to drive-in dopants from the dopant layer 112 into the substrate 100. The anneal process may include a rapid thermal anneal (RTA) with temperatures of between about 300 degrees C. to about 600 degrees C. for between about 1 minute to about 40 minutes. The anneal process drives the dopants (e.g., Ge) into the substrate 100 at locations where the dopant layer 112 is in contact with the substrate 100. Dopant regions 114 and 116 are formed which in turn form source and drain regions of the device. The dopant regions 114 and 116 are advantageously self-aligned since these regions 114 and 116 are formed using a conformal layer 112 that contacts the substrate 100 only at areas (105) opened up or patterned in earlier process steps. If the substrate 100 includes a p-type substrate, the dopant regions 114 and 116 that are produced are n-type. In other words, sufficient dopant concentrations are provided in dopant regions 114 and 116 to exceed the p-type concentrations to make the regions n-type.

In one embodiment, a Ge layer was formed on a p-type InGaAs layer and subjected to sheet resistance ($R_{sh}$) measurements for different anneal process parameters. Table I shows the results.

TABLE I

| Process | Temperature (degrees C.) | Time (minutes) | $R_{sh}$ (ohms/square) | Result |
|---|---|---|---|---|
| RTA | 400 | 10 | $1.03 \times 10^3$ | Ge starts to diffuse to reduce p-doping in substrate |
| RTA | 450 | 10 | $1.43 \times 10^3$ | Ge starts to diffuse to reduce p-doping in substrate |
| RTA | 500 | 10 | $0.80 \times 10^3$ | Ge further diffuses into substrate to convert p-type to n-type |
| RTA | 550 | 10 | $0.66 \times 10^3$ | Ge further diffuses into substrate to convert p-type to n-type |

Figure 4:
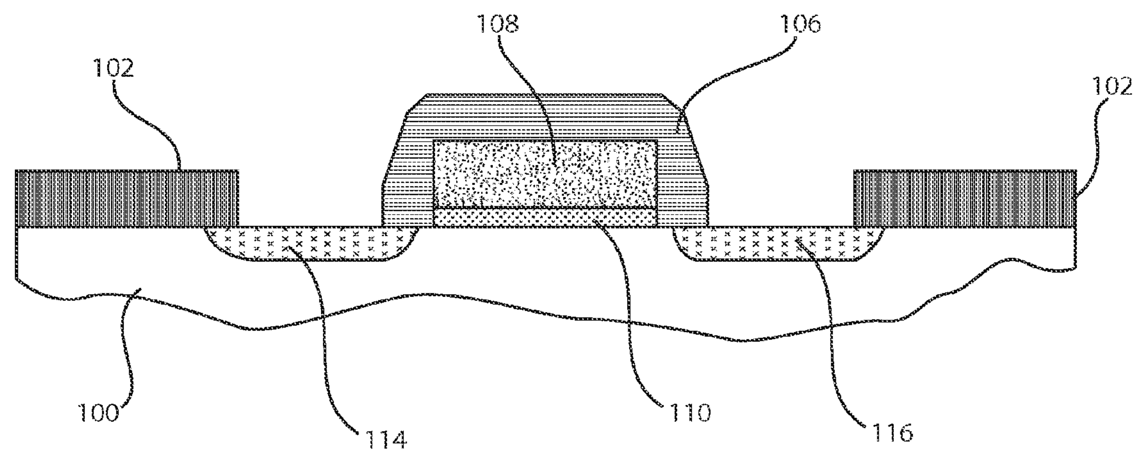
FIG. 4 is a cross-sectional view of the partially fabricated MOSFET device of FIG. 3 showing the dopant layer removed in accordance with the present principles.

Referring to FIG. 4, the dopant layer 112 is removed from the topology of the device. In one embodiment where the dopant layer 112 includes Ge, a hydrogen peroxide ($H_2O_2$) wet etch is employed to remove the dopant layer 112 and clean the surfaces of the device.

Figure 5:
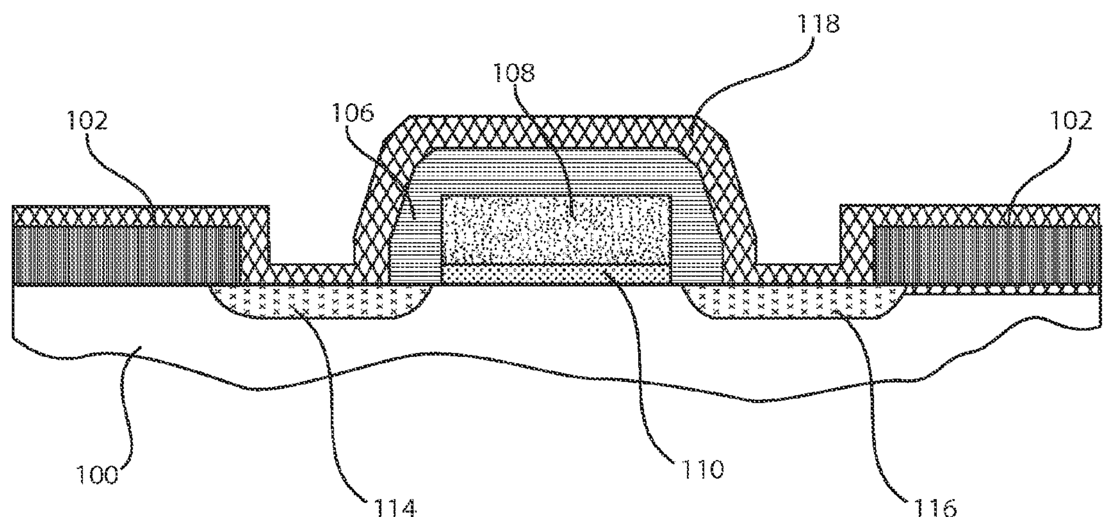
FIG. 5 is a cross-sectional view of the partially fabricated MOSFET device of FIG. 4 showing a metal containing layer formed over the device in accordance with the present principles.

Referring to FIG. 5, self-aligned contact regions (120, 122 in FIG. 6) may be formed. A metal layer or metal containing layer 118 is conformally formed over the topology of the device. The metal layer 118 is in contact with and is self-aligned to the underlying dopant regions 114 and 116. The metal layer 118 may include Ni, although other metals and alloys may be employed, such as W, Ti, Co, In, etc. The metal layer 118 may be deposited using a CVD process or other suitable process. The metal layer 118 may have a thickness of between about 1 nm to 100 nm.

Figure 6:
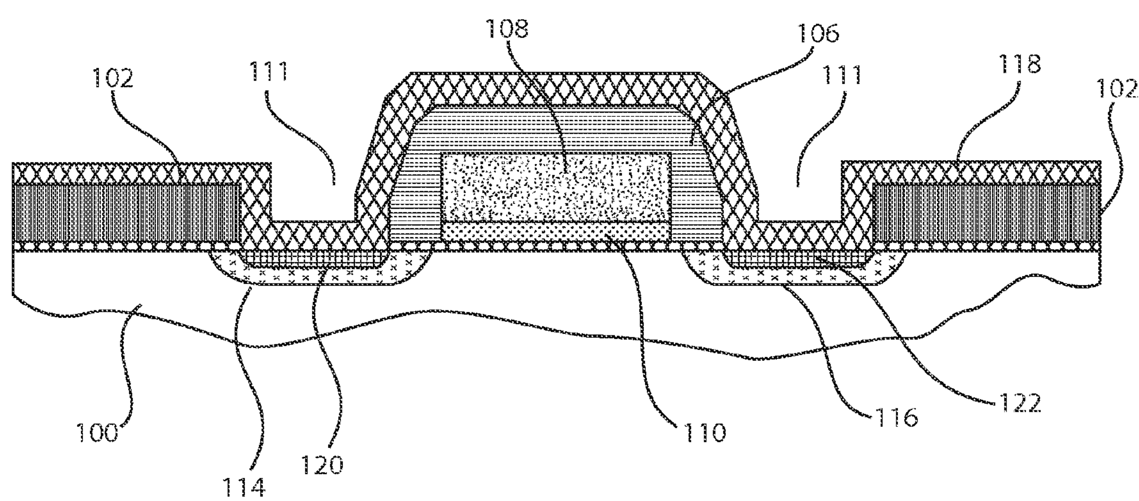
FIG. 6 is a cross-sectional view of the partially fabricated MOSFET device of FIG. 5 showing metal driven into the substrate at the exposed regions by an anneal process in accordance with the present principles.

Referring to FIG. 6, an anneal process is performed to drive in metal from the metal layer 118 into the dopant regions 114 and 116. The anneal process may include a rapid thermal anneal (RTA) with temperatures of between about 300 degrees C. to about 600 degrees C. for between about 10 seconds to about 40 minutes. The anneal process drives the metal (e.g., Ni) into the dopant regions 114 and 116 of the substrate 100 at locations where the metal layer 118 is in contact with the substrate 100. Contact regions 120 and 122 are formed, which are disposed within the dopant regions 114 and 116 and self-aligned to openings 111 between the field dielectric 102 and the gate stack 104. Contact regions 120 and 122 provided a silicide-like contact, which overcomes the contact resistance and other issues of conventional devices.

In one embodiment, the metal layer 118 includes Ni and the substrate includes InGaAs. The contact regions 120 and 122 preferably form an alloy of the metal and the substrate materials. In one example, a Ni—InGaAs alloy is formed by the anneal process. The contact regions 120 and 122 will be employed in subsequent steps as landing pads for midlevel contacts (not shown) to make electrical connections with higher metal layers.

Figure 7:
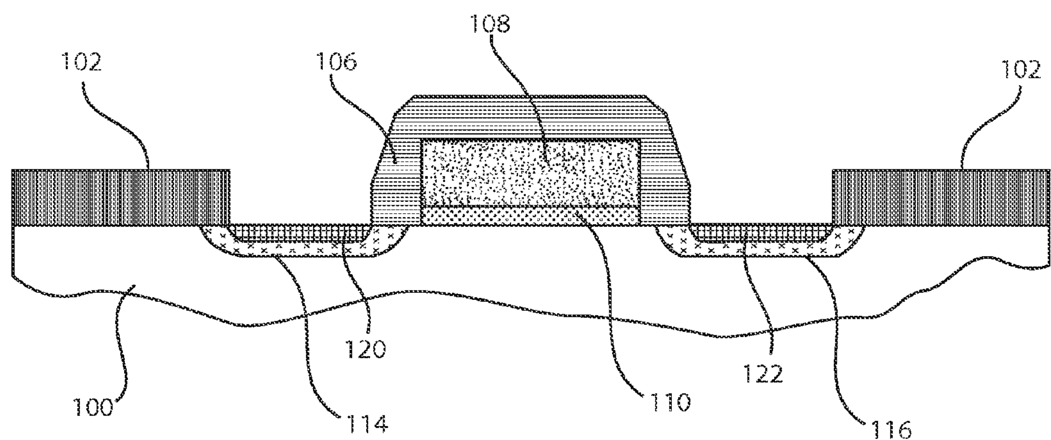
FIG. 7 is a cross-sectional view of the partially fabricated MOSFET device of FIG. 6 showing the metal layer removed in accordance with the present principles.

Referring to FIG. 7, the metal layer 118 is removed from the topology of the device. The metal layer 118 may be removed by a wet etch process, e.g., an HCl wet etch.

Figure 8:
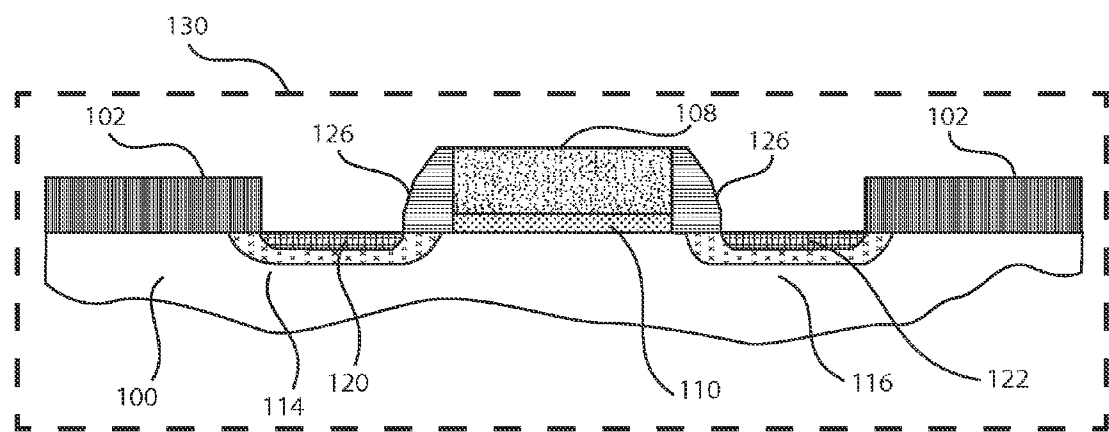
FIG. 8 is a cross-sectional view of the MOSFET device of FIG. 7 showing a cap layer removed from a gate structure in accordance with the present principles.

Referring to FIG. 8, layer 106 is etched or polished to remove a cap over the gate stack 104 to expose gate conductor 108. By removing the cap, spacers 126 are formed adjacent to the gate stack 104. An n-MOSFET device 130 is formed. Subsequent processing may include forming metal layers and other features.

Figure 9:
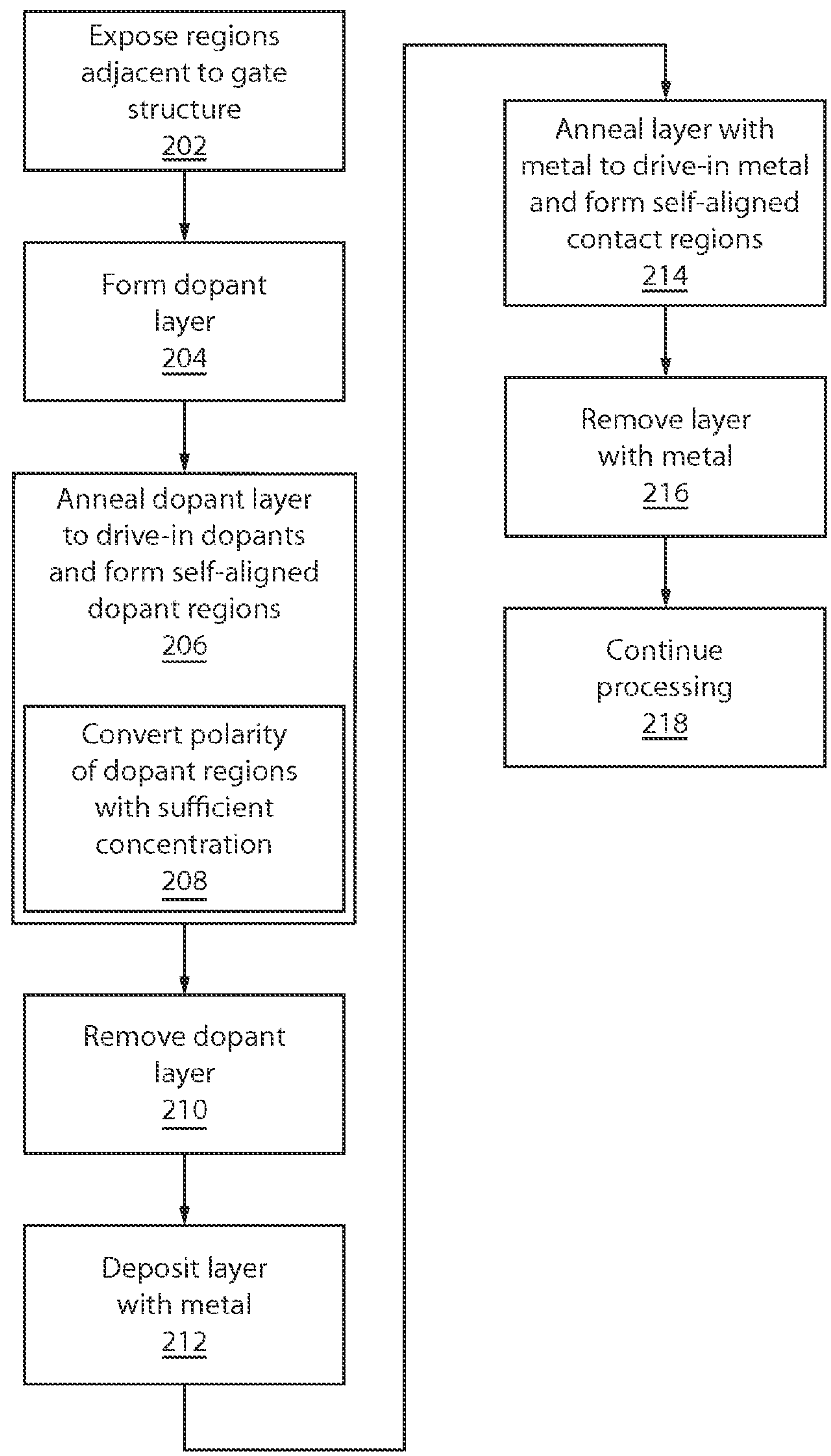
FIG. 9 is a block/flow diagram showing an illustrative method for fabricating a MOSFET with self-aligned source and drain regions and self-aligned contact pads formed in the source and drain regions in accordance with one illustrative embodiment.

Referring to FIG. 9, a block/flow diagram illustratively shows a method for fabricating a MOSFET with self-aligned source and drain regions and self-aligned metal contacts in accordance with the present principles. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In block 202, portions of a substrate adjacent to a gate stack or structure are exposed. This may include patterning a field dielectric layer or other mask and opening up portions adjacent to the gate stack. A clean etch (e.g., HF, HCl, etc.) may be performed to remove native oxide from the exposed areas of the substrate. The substrate preferably includes a III-V substrate, such as, e.g., GaAs, InGaAs, InP, etc. In block 204, a dopant layer is formed over the gate stack and in contact with the substrate in the portions exposed. This may include a PECVD process which deposits a Ge layer or a layer containing Ge. In block 206, the dopant layer is annealed to drive dopants into the substrate to form self-aligned dopant regions in the substrate. The dopant layer preferably includes Ge and the anneal process may include annealing with a rapid thermal anneal having a temperature of about 500 degrees for about 10 minutes. Other temperatures and times may be employed as well.

In block 208, in one embodiment, sufficient dopant concentration is provided from the dopant layer to convert the dopant regions from a first polarity to an opposite polarity. In one example, the substrate includes a p-type substrate, the dopants include n-type dopants (e.g., Ge) and the dopant regions are converted to n-type regions. In block 210, the dopant layer is removed. The dopant layer is preferably removed immediately after the anneal process by a wet etch.

In block 212, a metal containing layer is deposited over the gate stack and in contact with the substrate in the exposed portions. In block 214, the metal containing layer is annealed to drive metal into the substrate to form self-aligned contact regions as a metal alloy formed in the substrate within the dopant regions. In one embodiment, the substrate includes InGaAs, the metal layer includes Ni and the metal alloy includes a Ni—InGaAs alloy. In block 216, the metal layer is removed. In block 218, middle end of line and back end of line processing is continued as in known in the art.

Having described preferred embodiments for a self-aligned III-V MOSFET diffusion regions and silicide-like alloy contact (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a metal oxide semiconductor field effect transistor, comprising:

exposing portions on a substrate having a first dopant polarity adjacent to a gate stack;

forming a dopant layer over the gate stack and in contact with the substrate in the portions exposed;

annealing the dopant layer to drive dopants into the substrate to form self-aligned dopant regions in the substrate, providing sufficient dopant concentration in the substrate to convert the dopant regions from the first dopant polarity to an opposite dopant polarity;

removing the dopant layer;

depositing a metal containing layer over the gate stack and in contact with the substrate in the exposed portions;

annealing the metal containing layer to drive metal into the substrate to form self-aligned contact regions in a metal alloy formed in the substrate within the dopant regions; and removing the metal layer.

2. The method as recited in claim 1, wherein forming a dopant layer includes forming a layer containing Ge.

3. The method as recited in claim 1, wherein the substrate includes a III-V material.

4. The method as recited in claim 1, wherein the substrate includes a p-type substrate and the dopants include n-type dopants and the dopant regions are converted to n-type regions.

5. The method as recited in claim 1, wherein exposing portions on a substrate adjacent to a gate stack includes patterning a field dielectric to expose the substrate.

6. The method as recited in claim 1, wherein the substrate includes InGaAs and the metal layer includes Ni and the metal alloy includes a Ni—InGaAs alloy.

7. The method as recited in claim 1, wherein the dopant layer includes Ge and the step of annealing the dopant layer includes annealing with a rapid thermal anneal having a temperature of about 500 degrees for about 10 minutes.

8. The method as recited in claim 1, wherein removing the dopant layer includes performing an etch immediately after the step of annealing the dopant layer.

9. A method for forming a metal oxide semiconductor field effect transistor, comprising:

exposing portions on a p-type III-V substrate adjacent to a gate stack;

forming a dopant layer containing Ge over the gate stack and in contact with the substrate in the portions exposed;

annealing the dopant layer to drive Ge dopants into the substrate to form self-aligned dopant regions in the substrate and to convert the p-type substrate to n-type in the dopant regions;

removing the dopant layer;

depositing a metal containing layer having Ni over the gate stack and in contact with the substrate in the exposed portions;

annealing the metal containing layer to drive Ni into the substrate to form self-aligned contact regions in a metal alloy formed in the substrate within the dopant regions; and removing the metal containing layer.

10. The method as recited in claim 9, wherein the substrate includes GaAs.

11. The method as recited in claim 9, wherein exposing portions on a substrate adjacent to a gate stack includes patterning a field dielectric to expose the substrate.

12. The method as recited in claim 9, wherein the substrate includes InGaAs and the self-aligned contact regions include a Ni—InGaAs alloy.

13. The method as recited in claim 9, wherein annealing the dopant layer includes annealing with a rapid thermal anneal having a temperature of about 500 degrees for about 10 minutes.

14. The method as recited in claim 9, wherein removing the dopant layer includes performing an etch immediately after the step of annealing the dopant layer.

* * * * *